United States Patent
Yeh et al.

[11] Patent Number: 6,004,852
[45] Date of Patent: Dec. 21, 1999

[54] MANUFACTURE OF MOSFET HAVING LDD SOURCE/DRAIN REGION

[75] Inventors: Wen-Kuan Yeh; Coming Chen; George Chou, all of Hsin-Chu, Taiwan

[73] Assignee: United Microelectronics Corp., Hsin-Chu City, Taiwan

[21] Appl. No.: 08/864,217

[22] Filed: May 28, 1997

Related U.S. Application Data

[60] Provisional application No. 60/036,967, Feb. 11, 1997.
[51] Int. Cl.$^6$ .................................................. H01L 21/3205
[52] U.S. Cl. ............................................................ 438/303
[58] Field of Search ..................................... 438/305, 307, 438/301, 303

[56] References Cited

U.S. PATENT DOCUMENTS

| | | |
|---|---|---|
| 4,784,965 | 11/1988 | Woo et al. . |
| 4,818,714 | 4/1989 | Haskell . |
| 4,981,810 | 1/1991 | Fazan et al. . |
| 5,200,351 | 4/1993 | Hadjizadeh-Amini ................... 438/307 |
| 5,272,100 | 12/1993 | Satoh et al. . |
| 5,391,508 | 2/1995 | Matsuoka et al. . |

*Primary Examiner*—Richard Booth
*Attorney, Agent, or Firm*—Rabin & Champagne, P.C.

[57] ABSTRACT

An LDD source/drain region is manufactured adjacent a gate electrode using a single ion implantation step. The method begins by providing a polysilicon gate electrode on a gate oxide over a substrate and then providing a thin, layer of CVD oxide over the gate electrode and over the substrate. A thicker, second layer of a material different from the first silicon oxide layer is deposited over the device and is etched back to form sidewall spacer structures alongside and spaced slightly from the gate electrode. The spacer structures formed from the second layer are then used as a mask to etch the oxide layer where it is exposed over the active regions of the substrate and then the spacer structures are removed. The portion of the oxide layer that remains over the top and sides of the gate electrode and over portions of the substrate adjacent the gate electrode is then used as a mask for an ion implantation process. Implantation through the mask forms a more lightly doped and more shallowly doped region in the substrate beneath the mask and a more heavily doped and more deeply doped region in the portions of the source/drain regions that were not covered by the mask. Accordingly, implantation through the mask formed in this way forms a complete source/drain region having a lightly doped drain structure alongside the FET of the integrated circuit device. Formation of LDD source/drain regions in this manner saves a number of manufacturing steps, resulting in reduced turn around time and reduced costs.

1 Claim, 3 Drawing Sheets

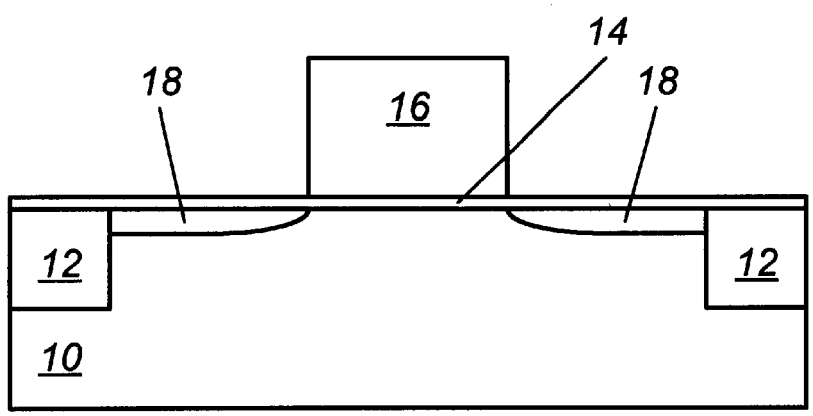
FIG. 1 -- Prior Art
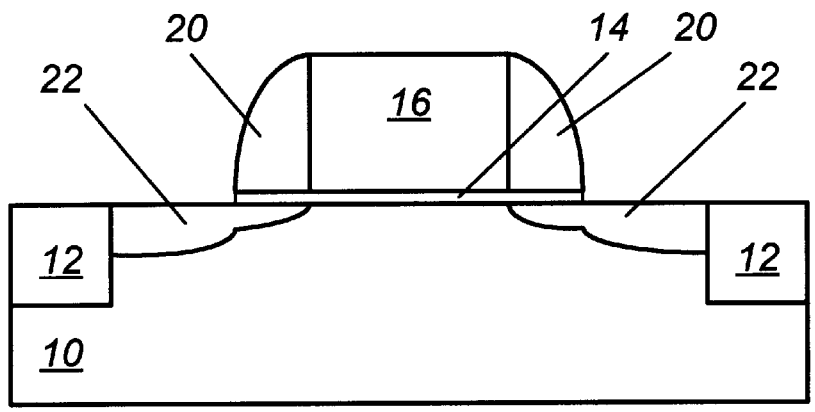
FIG. 2 -- Prior Art
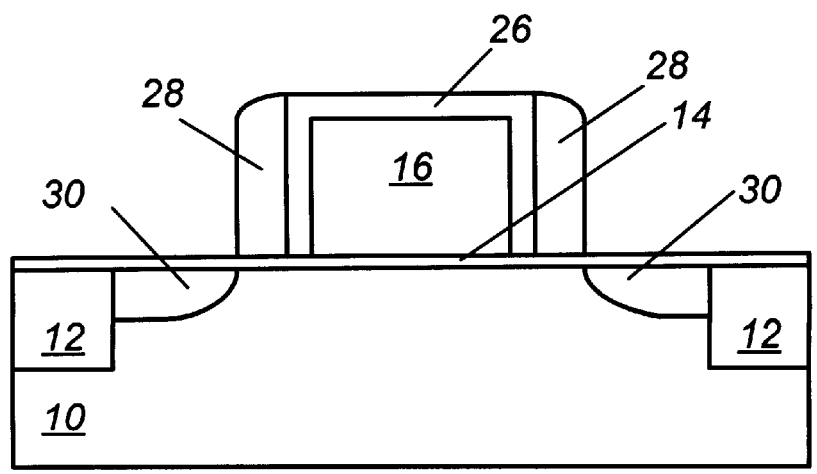
FIG. 3 -- Prior Art

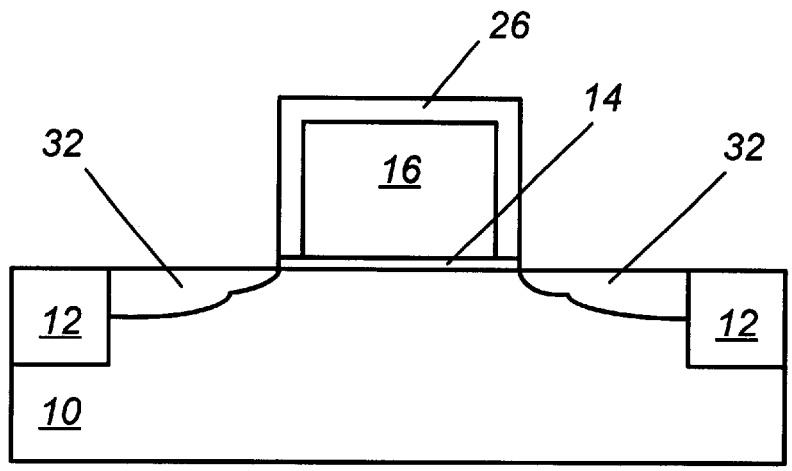
FIG. 4 -- Prior Art
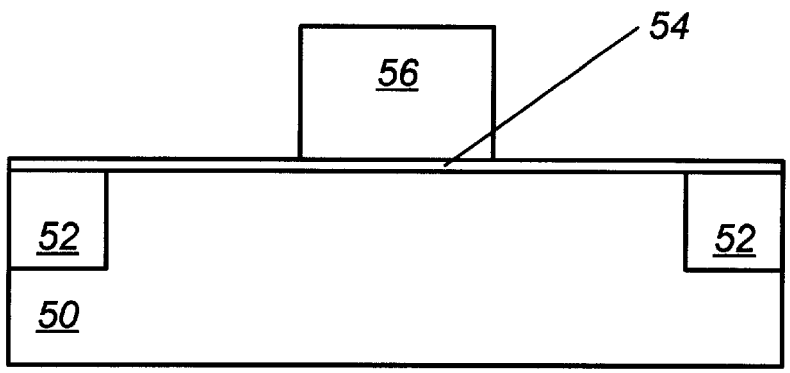
FIG. 5
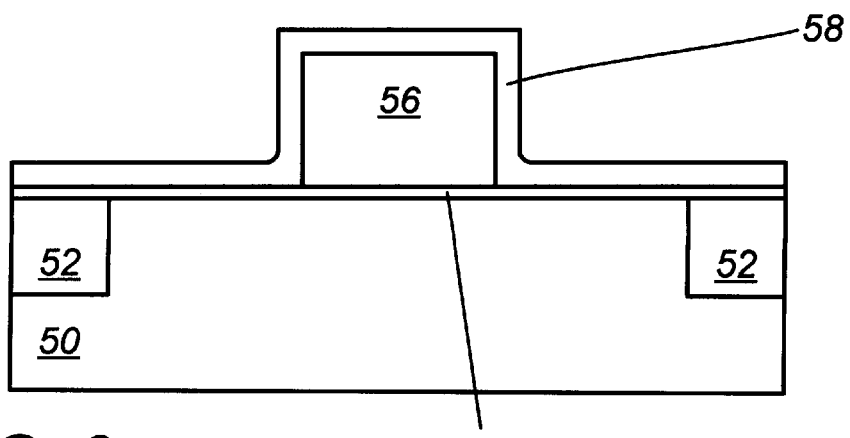
FIG. 6

MANUFACTURE OF MOSFET HAVING LDD SOURCE/DRAIN REGION

This application claims priority from provisional application Ser. No. 60/036,967, filed Feb. 11, 1997.

BACKGROUND OF THE INVENTION

1. Field of the Invention

The present invention relates to the formation of high density integrated circuits and, more particularly, to the simplified formation of MOSFET devices having LDD source/drain structures.

2. Description of the Related Art

Very small field effect transistors (FETs), i.e., those FETs made in accordance with small design rules, often form one or both of the FET source/drain regions with a majority carrier concentration that decreases near the channel region of the FET. Because these structures are most frequently provided for the drain regions of FETs, source/drain regions that have a decreased majority carrier concentration adjacent the channel region of the FET are generally said to have a "lightly doped drain" or "LDD" structure, despite the slight misnomer of applying this label to the source region of the FET. The simplest and most frequently implemented LDD structure is one where the source/drain region has two distinct doping levels, with the lower doping level lying next to the channel of the FET and the relatively higher doping level displaced laterally away from the FET. This structure reduces the electric field between the source/drain regions and between the gate and the source/drain region which has the LDD structure. In essence, the more lightly doped portion of the LDD structure acts as a series resistance between the more highly doped portion of the LDD source/drain region and the channel and, in some cases, the gate of the FET. There is a potential drop across the more lightly doped portion of the LDD source/drain region so that the electric fields corresponding to a potential applied to the source/drain region fall off across the lightly doped portion of the LDD source/drain region. The reduced electric fields adjacent the lightly doped portion of the LDD reduce several FET degradation problems related to the so-called hot carrier effect, including electron injection into the gate oxide layer.

FIGS. 1 and 2 illustrate steps in the most common process used for forming a MOSFET (metal oxide semiconductor FET) with source/drain regions having an LDD structure. Referring to FIG. 1, the illustrated FET is formed on a P-type substrate 10 and include field isolation structures 12 to isolate the FET from other, adjacent FETs or other devices. The illustrated FET is one of what is typically an array including a large number of FETs in typical integrated circuit devices. Shallow trench isolation structures of the type illustrated in FIG. 1 might be formed by etching an array of trenches into the silicon substrate 10 and then filling the trenches with a combination of thermally grown silicon oxide and chemical vapor deposited (CVD) silicon oxide. Other field isolation structures include field oxide regions formed entirely by thermal oxidation, as in the conventional local oxidation of silicon (LOCOS) method. A gate oxide layer 14 is formed by thermal oxidation on the active device region between the field isolation regions 12 and a polysilicon gate electrode 16 is formed on the gate oxide layer 14. Polysilicon gate electrodes 16 are formed by depositing a layer of polysilicon over the substrate, typically using low pressure chemical vapor deposition (LPCVD). The gate electrode may be doped in situ by adding a dopant gas such as phosphine or arsine to the CVD silane source gas, or the gate electrode may be doped by implanting impurities into the polysilicon and activating the impurities to render the polysilicon layer conductive. The gate electrodes are patterned using conventional photolithography techniques. Variations on the illustrated gate electrode structure are known. For example, the layer of polysilicon might be covered by a layer of a refractory metal or by a metal suicide to reduce the resistivity of the gate electrode. A layer of silicon oxide or other insulator might also be provided over the polysilicon gate electrode 16 to protect the electrode in subsequent processing steps and, often, to serve as an etch stop for subsequent etching steps.

The LDD source/drain regions are formed in a two stage implantation process. After the gate electrode 16 has been defined by photolithography, a first, comparatively low level implantation is provided into those portions of the active device regions not masked. The implantation is typically, but not always, made with a dopant of a conductivity type opposite to the conductivity type of the substrate 10 surface region under the gate electrode. This implantation forms lightly doped regions 18 self-aligned to the edges of the gate electrode 16 and extending from below the edges of the gate electrode 16 to the field isolation structures 12 on either side of the gate electrode 16. Next, as shown in FIG. 2, sidewall oxide spacer structures 20 are formed adjacent the gate electrode 16 by first depositing CVD silicon oxide over the device and then anisotropically etching back the oxide layer to expose the substrate over the existing lightly doped portions 18 of the source/drain regions. Etching back the CVD oxide layer produces the spacer oxide regions 20 on either side of the polysilicon gate electrodes 16. After the spacer oxide regions 20 are provided on either side of the polysilicon gate electrodes 16, a second, heavier ion implantation is made self-aligned to the spacer oxide regions 20 with a dopant of a conductivity type opposite to the conductivity type of the substrate under the gate electrode 16.

The silicon oxide spacers of this first strategy for forming LDD source/drain structures are typically left in place in the completed device. Thus, the spacers are present in all future processing steps. Because the oxide spacer structure is made of a material different from the gate electrode and the substrate, subsequent thermal processing introduces stress between the spacers and the gate electrode and substrate. These stresses can introduce defects or otherwise adversely effect the properties of the source/drain regions or the FET.

An alternative strategy for forming LDD source/drain regions is illustrated in FIGS. 3–4. In this variation of the process for forming LDD source/drain regions adjacent the gate of a FET, the more heavily doped portions of the LDD source/drain regions are formed first and then the more lightly doped portions of the LDD source/drain regions are formed. In this alternative method, temporary spacer structures are used in the initial implantation step to space the more heavily doped portions of the source/drain regions away from the gate electrode. The spacer structures are then removed, and the more lightly doped portions of the source/drain regions are formed. An intermediate stage in the manufacture of a MOSFET device according to this alternative strategy is shown in FIG. 3, where a polysilicon gate electrode 16 is formed on a gate oxide layer 14 to cover the active device region between field isolation structures 12. The gate electrode 16 is covered by a layer of silicon oxide (silicon oxide coating 26) by either CVD or by thermal oxidation of the polysilicon gate electrode. A layer of polysilicon is then deposited over the device and etched back to form temporary polysilicon spacers 28 spaced from and parallel to the edges of the gate electrode 16. The silicon oxide coating 26 over the gate electrode and the gate oxide layer 14 over the substrate are used as an etch stop for the etching of the polysilicon spacers 28. A first implantation is made into the FIG. 3 structure self-aligned to the polysilicon spacers. This first implantation is a comparatively heavy implantation and forms the more heavily doped portions 30 of the LDD source/drain regions. The polysilicon spacers 28 are then removed, and a second, comparatively light ion implantation is made self aligned to the silicon oxide coating 26 to define the LDD source/drain regions 32.

Both of the LDD source/drain manufacturing processes described in the background require formation of a spacer and require two distinct implantation steps separated by a number of processing steps. Each manufacturing step used in the manufacture of an integrated circuit device carries a cost associated with the longer manufacturing process.

SUMMARY OF THE PREFERRED EMBODIMENTS

It is accordingly an object of the present invention to provide an LDD source/drain region for a MOSFET using fewer manufacturing steps.

One aspect of the present invention provides a method of forming an integrated circuit device on a substrate having device isolation structures formed thereon to define an active device region. A gate insulating layer is provided on the substrate over the active device region and a gate electrode having first and second sides is provided over the gate insulating layer. A first insulating layer is formed over the gate electrode and over the active device region and then a second layer of a material different from the first insulating layer is formed over the first layer of insulating material. The second layer is etched back to form sidewall spacer structures along the first and second side of the gate electrode and then etching the first insulating layer where exposed by the sidewall spacer structures to define a masking portion of the first insulating layer on the active device region. LDD Source/drain regions are formed by implanting through the masking portion of the first insulating layer to form a comparatively shallow, comparatively lightly doped region in the active device region and in the same step implanting into other portions of the active device region.

Another aspect of the invention forms an integrated circuit device on a substrate having an active region defined between two device isolation structures. A gate insulating layer is formed on the substrate over the active device region and a gate electrode is formed over the gate insulating layer. An LDD source/drain mask is formed on either side of the gate electrode, with a first portion of the mask having a first thickness through which ions can be implanted and a second portion of the mask being open, the first portion of the mask disposed between the second portion of the mask and the gate electrode. An LDD source/drain region is formed by implanting through the first portion of the LDD source/drain mask to form a comparatively shallow, comparatively lightly doped region in the active device region below the first portion of the mask and in the same step implanting into the second portion of the mask to form a comparatively deeper, comparatively heavily doped region in the active device region.

BRIEF DESCRIPTION OF THE DRAWINGS

FIGS. 1–2 illustrate steps in one conventional process of forming a MOSFET incorporating LDD source/drain regions.

FIGS. 3–4 illustrate steps in a different conventional process of forming a MOSFET incorporating LDD source/drain regions.

FIGS. 5–9 illustrate steps in forming an integrated circuit device in accordance with preferred embodiments of the present invention.

DETAILED DESCRIPTION OF THE PREFERRED EMBODIMENTS

Figure 7:
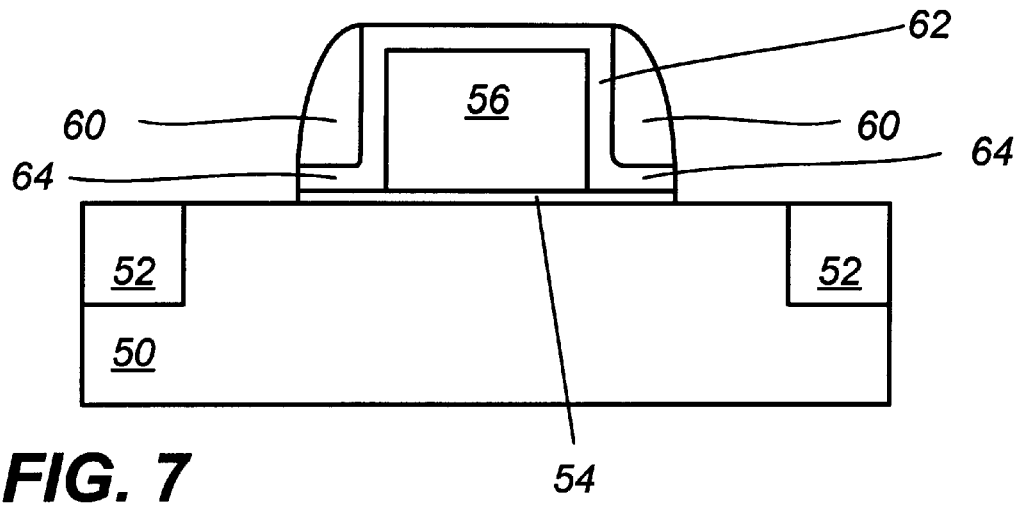

Preferred embodiments of the present invention form an LDD source/drain region in a single implantation step. This may be accomplished by providing a mask over the substrate adjacent the gate electrode that is partially blocking and partially transmissive of a flux of dopant ions during the ion implantation step. Implantation through the mask forms a more lightly doped and more shallowly doped region in the substrate beneath the mask and a more heavily doped and more deeply doped region in the portions of the source/drain regions that were not covered by the mask. Formation of LDD source/drain regions in this manner saves a number of manufacturing steps, resulting in reduced turn around time and reduced costs. The reduction in the number of processing steps is doubled when the invention is used to manufacture LDD source/drain regions for both the NMOS and PMOS devices of integrated circuit devices which include both types of devices, such as CMOS circuits. Some embodiments of the invention provide the further advantage of providing an oxide covering over the gate electrode that is thinner and produces less stress on adjacent device elements than in the conventional oxide sidewall spacers technology.

In a particularly preferred method of manufacturing an integrated circuit device in accordance with the invention, an LDD source/drain region is manufactured by providing a polysilicon gate electrode on a gate oxide layer on the active device region of a substrate. A thin, first layer of a first insulating material that might be CVD oxide is deposited over the gate electrode and over the substrate. A thicker, second layer of a material different from the first insulating material is deposited over the device and is etched back to form sidewall spacer structures alongside and spaced slightly laterally from the gate electrode. The second layer might be silicon nitride. The spacer structures formed from the second layer are then used as a mask to etch the first layer where it is exposed over the active regions of the substrate and then the spacer structures are removed. The portion of the first layer that remains over portions of the substrate adjacent the gate electrode is then used as a partial mask for an ion implantation process. Implantation through the partial mask formed from the first layer and into the substrate adjacent the mask which is exposed by the mask forms a complete source/drain region having a lightly doped drain structure alongside the FET of the integrated circuit device.

Particularly preferred embodiments of the present invention are now described with reference to FIGS. 5–9. Although the following describes a MOSFET having a simple polysilicon gate electrode, it should be understood that variations on the described structure including multi-layer gate electrodes, different gate dielectrics and different device isolation structures are contemplated but are not described herein since such variations are well known. In addition, this specification uses the term MOSFET in the generic manner as is the practice in the industry. The term MOSFET refers to a broad class of devices incorporating a gate electrode separated from a channel region by a gate insulator and having at least one source/drain region with an LDD structure.

Referring first to FIG. 5, a small portion of an integrated circuit device in accordance with preferred embodiments of the invention is illustrated at an intermediate stage in the manufacturing process. The partially completed device is formed on a silicon substrate 50 that is provided with device isolation structures 52. In the illustrated embodiment, the device isolation structures 52 are shallow trenches filled with a thin inner liner of thermal oxide and a central oxide plug formed from CVD oxide deposited from a TEOS source gas. Alternately, the device isolation structures might be field oxide regions formed using a standard local oxidation of silicon (LOCOS) process. The device isolation structures 52 define the active region on which the FET of the present invention may be formed. A gate oxide layer 54 is grown on the surface of the substrate in the active region, typically to a thickness of about 30–200 Å by a thermal oxidation process in an oxygen environment at a temperature of 800–1000° C. A layer of polysilicon is deposited by LPCVD over the surface of the device to a thickness of 1000–3000 Å and more preferably to a thickness of approximately 2500 Å. The layer of polysilicon is either doped in situ during deposition or by ion implantation, typically using arsenic or phosphorus in the conventional fashion. In some embodiments, the doping of the polysilicon layer is accomplished at the same time that doped regions are formed in the substrate of the device; in other embodiments, the polysilicon layer is doped at an earlier stage and an oxide or other protective capping layer is provided over the surface of the gate electrode 56 to protect it from other implantation processes. Depending on the particular gate electrode structure and doping strategy, the polysilicon layer is patterned to define the gate electrode 56 shown in FIG. 5 either before or after ion implantation is performed.

Next, a first insulating layer 58 (FIG. 6) is deposited over the gate electrode and over the other portions of the active region. It is preferred that the first layer 58 be an insulating material so that the layer can be left in place over and alongside the gate electrode through further processing steps and in the completed device. Silicon oxide, for example silicon oxide deposited by CVD or by plasma enhanced CVD (PECVD), is a particularly well suited material for the first layer because its is compatible with the polysilicon gate electrode and with further processing steps. If portions of the first silicon oxide layer are left on the gate electrode through further processing, the first silicon oxide layer will provide many of the same protective functions as are provided to the sidewalls of gate electrodes by the conventional silicon oxide sidewall structures used in the conventional processes for forming LDD structures. An oxide structure along the invention's gate has the advantage, however, that the first silicon oxide layer is much thinner than the conventional silicon oxide spacer that is used in the conventional process of forming LDD structures. The first layer of insulating material is deposited to a thickness of between about 110–200 Å over and along the sides of the gate electrode. If the gate oxide layer 54 remains on the exposed surfaces of the substrate over the active regions, the first insulating layer is deposited over the gate oxide layer so that the total thickness of the layer 58 over the active regions is between about 140–250 Å; otherwise the thickness of the oxide layer 58 over the substrate adjacent the gate electrode 56 is about 110–200 Å. The thickness of the oxide layer 58 over the substrate sets the depth and consequently the doping level for the lightly doped portion of the LDD source/drain region to be formed. Accordingly, the total thickness of the oxide layer over the portion of the substrate where the source/drain region will be formed is chosen to set the depth and the doping level desired for the lightly doped portion of the LDD source/drain region. Choosing the appropriate thickness can be accomplished by empirical means or through the use of models to predict the results of ion implantation and diffusion on the end device performance. Such models are well-known and widely implemented in other aspects of the semiconductors arts.

A second layer of material is then deposited over the FIG. 6 structure. The material chosen for the second layer is preferably different from the material used in the first insulating layer 58, so that the first insulating layer can be used as an etch stop in a process used for etching the second layer. The second layer of material is deposited and then etched back to form sidewall spacer structures on a portion of the first insulating layer. Materials that are appropriate for the second layer include polysilicon and silicon nitride. Polysilicon is a less preferred choice because of the possibility that the sidewall spacer etchback process might leave undesirable, potentially conductive stringers over other portions of the device. Silicon nitride is a presently preferred choice because it is insulating and so poses little threat to device performance and reliability if a portion of the layer is inadvertently left in place over another portion of the device. Silicon nitride is also suitable because of the ease with which it can be selectively etched, with little effect on the underlying silicon oxide layer 58. The second layer is thus preferably silicon nitride deposited by CVD. The thickness of the second layer deposited determines the width of the spacer left along the sidewall of the gate electrode which in turn determines the length, as measured from the gate electrode 56, of the lightly doped portion of the LDD source/drain region. Accordingly, the thickness to which the second layer is deposited is chosen to fix the length of the LDD region. The thickness of the second layer, for example, might be about 1500–2000 Å. Because the sidewall width extends away from the portion 62 of the first oxide layer that extends alongside the gate electrode 56, the thickness of the second layer and thus the width of the sidewall spacer structure 60 is selected to determine the total length of the lightly doped portion of the LDD source/drain region.

The second layer is then etched back to form spacers 60 on the oxide layer 58 and alongside the portion 62 of the first layer that extends along the side of the gate electrode 56. When silicon nitride is used as the second layer, sidewall spacer material, the spacers may be formed using reactive ion etching (RIE) using source gases including $SF_6$, $Cl_2$ and HBr to generate the etchant. An appropriate etching environment might be the LAM Rainbow system, which provides adjustable selectivity between etching silicon nitride and etching silicon oxide on the basis of the gas mixture from which the RIE etchant is derived. Once the sidewall spacers 60 are formed, the spacers are used to etch the exposed portion of the first oxide layer so that a length of the silicon oxide layer 64 remains on the surface of the substrate of the active region.

The edge of the portion of the first oxide layer 64 that lies on the substrate will define the transition from the more lightly doped portion of the LDD source/drain region and the more heavily doped portion of the LDD source/drain region. The silicon oxide layer is then etched, preferably in a reactive ion etching (RIE) process using an etchant derived from a plasma of $CF_4$ or another fluorine bearing species, possibly in the same system in which the sidewall spacers 60 are formed. Preferably, this etching process is accomplished in the same etching system as is used in etching the second layer to form the sidewall spacers 60 without removing the substrate from the etching chamber. The final structure is shown in FIG. 7.

The silicon nitride spacers 60 are then removed in preparation for the source/drain ion implantation process. The silicon nitride can be removed in a variety of ways, but the spacers 60 are most preferably removed by dipping the substrate in a hot phosphoric acid ($H_3PO_4$) solution, since this wet etching process is likely less damaging to the other structures on the surface of the substrate than are plasma etching processes. The remaining portions of the first silicon oxide layer form an ion implantation mask over the substrate. A portion 62 of the first silicon oxide layer extends vertically alongside the gate electrode 56 and a portion 64 of the first silicon oxide layer lies on the surface of the substrate. The vertically extending portion of the first silicon oxide layer is completely blocking to the subsequent ion implantation, and the horizontally extending portion 64 of the first oxide layer is partially transmissive and partially blocking of the implanted ions. Most preferably, the exposed portions of the substrate are bare, to the extent feasible, adjacent the horizontal portions 64 of the silicon oxide implantation mask.

Figure 8:
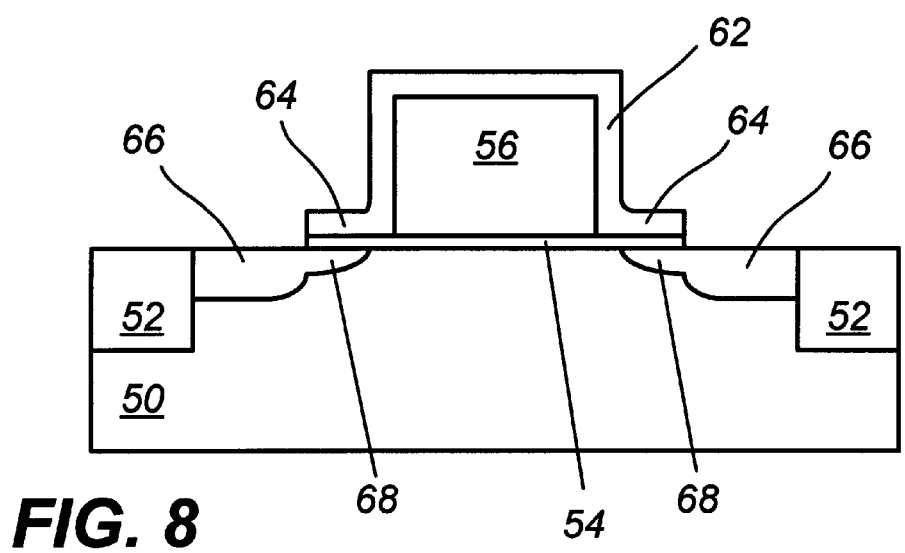

Ion implantation is then performed to form the LDD source/drain regions. The inner edge of the implanted regions are aligned with the outer edge of the vertical portion of the implantation mask 62 and the implantation boundary between the lightly doped 68 and the more heavily doped 66 portions of the source/drain regions is aligned with the edge of the horizontal portion 64 of the implantation mask, as shown in FIG. 8. The implantation may be made using any of the conventional dopants used for forming source/drain regions. Because of the small size of this structure, it is preferred that, to the extent possible, more slowly diffusing dopants are used in this structure. The source/drain implantation can be made using a dose of between about $5 \times 10^{14}/cm^2$ to about $5 \times 10^{15}/cm^2$ and more preferably about $1 \times 10^{15}/cm^2$ at an energy of between about 10–55 KeV. Lower energies are used for lighter dopants. For example, boron ions may be implanted into the source/drain regions of PMOS devices at an energy of about 10 KeV, while arsenic ions can be implanted into the source/drain regions of NMOS devices at an energy of about 50 KeV.

Figure 9:
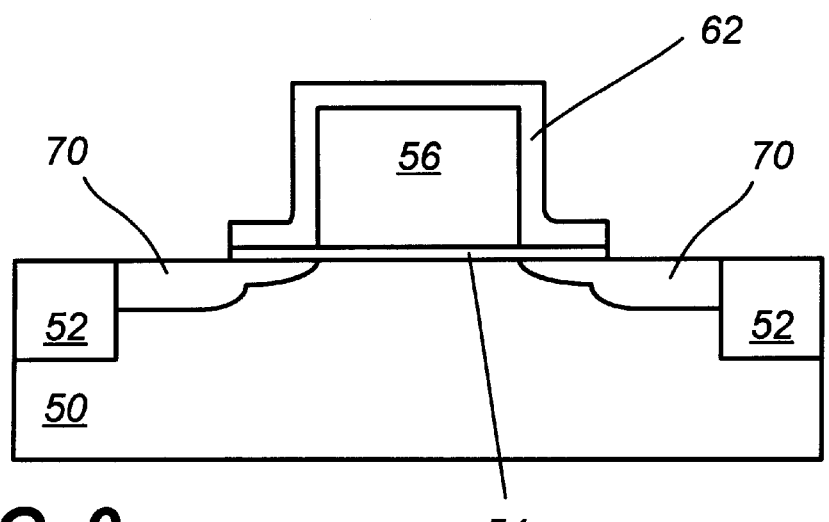

At some point after implantation, the source/drain regions are preferably activated by annealing. The annealing process is preferably accomplished by rapid thermal processing at a temperature of between about 950°–1100° C. for a time period from a few seconds up to tens of seconds. Annealing causes the dopants in the source/drain regions to diffuse, producing an LDD source/drain structure 70 like that illustrated in FIG. 9. Further processing continues in the conventional manner to complete the CMOS or other integrated circuit device in which the structure of FIG. 9 is formed.

The present invention has been described in terms of particularly preferred embodiments. The ordinarily skilled artisan will appreciate, however, that a number of variations and modifications to these embodiments could be made without varying from the basic teachings of the present invention. Accordingly, the scope of the present invention is not to be limited to any particular embodiment Rather, the scope of the present invention is to be determined by the claims which follow.

What is claimed:

1. A method of forming an integrated circuit device comprising:

providing a substrate having device isolation structures formed thereon, an active device region, devoid of dopant of a conductivity type opposite to the conductivity type of the substrate, being defined between the device isolation structures;

providing a gate insulating layer on the substrate over the dopant devoid active device region;

providing a gate electrode over the gate insulating layer, the gate electrode having first and second sides;

forming a first insulating layer over the gate electrode and over the dopant devoid active device region;

forming a second layer of a material different from the first insulating layer over the first layer of insulating material;

etching the second layer to form sidewall spacer structures along the first and second sides of the gate electrode and then etching to completely remove a portion of the first insulating layer that is not covered by the sidewall spacer structures to define a masking portion of the first insulating layer on the dopant devoid active device region; and by a single stage ion implantation, forming an LDD source/drain region adjacent to the gate electrode, after said etching, including doping the portion of the dopant devoid active device region beneath the masking portion, by implanting ions through the masking portion to form a comparatively shallow, comparatively lightly doped region in the active device region, and doping the portion of the dopant devoid active device region not covered by the masking portion, by implanting ions to form a comparatively deep, comparatively heavily dosed region in the active device region, wherein the first insulating layer is an oxide of silicon and the second layer is silicon nitride.

* * * * *